(12) United States Patent
Zhu et al.

(10) Patent No.: US 11,984,357 B2
(45) Date of Patent: May 14, 2024

(54) SEMICONDUCTOR STRUCTURE AND ITS MANUFACTURING METHOD

(71) Applicant: CHANGXIN MEMORY TECHNOLOGIES, INC., Hefei (CN)

(72) Inventors: BingYu Zhu, Hefei (CN); Hai-Han Hung, Hefei (CN); Yin-Kuei Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 368 days.

(21) Appl. No.: 17/504,800

(22) Filed: Oct. 19, 2021

(65) Prior Publication Data

US 2022/0084881 A1 Mar. 17, 2022

Related U.S. Application Data

(63) Continuation of application No. PCT/CN2021/103800, filed on Jun. 30, 2021.

(30) Foreign Application Priority Data

Sep. 14, 2020 (CN) .......................... 202010963896.9

(51) Int. Cl.
  *H01L 21/768* (2006.01)
  *H01L 23/522* (2006.01)
  (Continued)

(52) U.S. Cl.
  CPC .. *H01L 21/76877* (2013.01); *H01L 21/76831* (2013.01); *H01L 23/5223* (2013.01);
  (Continued)

(58) Field of Classification Search
  CPC ......... H01L 21/76898; H01L 21/76877; H01L 21/76831; H01L 23/5223; H01L 23/5226; H01L 23/5283; H10B 12/37; H10B 41/27
  See application file for complete search history.

(56) References Cited

U.S. PATENT DOCUMENTS 10,290,422 B1  5/2019  Wang et al.
2004/0217406 A1* 11/2004  Chung ............... H10B 12/0335
                                    257/E27.088
(Continued)

FOREIGN PATENT DOCUMENTS

CN   103390541 A   11/2013
CN   111108619 A   5/2020

OTHER PUBLICATIONS

ISR Written Opinion for International Application PCT/CN2021/103800 mailed Sep. 28, 2021.
(Continued)

*Primary Examiner* — Jaehwan Oh
*Assistant Examiner* — John M Parker
(74) *Attorney, Agent, or Firm* — Ladas & Parry LLP

(57) ABSTRACT

The present application discloses a semiconductor structure. The semiconductor structure includes: a substrate, the substrate being provided with a conductive structure; a first lower electrode and a second lower electrode sequentially stacked, the first lower electrode being located between the second lower electrode and the substrate, and the first lower electrode being electrically connected to the conductive structure; a first dielectric layer and a first upper electrode, the first dielectric layer covering a sidewall surface of the first lower electrode, and the first upper electrode being located on one side of the first dielectric layer away from the first lower electrode; and a second dielectric layer and a second upper electrode, the second dielectric layer covering an inner wall and a bottom surface of the second lower electrode, and the second upper electrode filling the recess of the second lower electrode.

16 Claims, 19 Drawing Sheets

(51) Int. Cl.
*H01L 23/528* (2006.01)
*H01L 49/02* (2006.01)

(52) U.S. Cl.
CPC ...... *H01L 23/5226* (2013.01); *H01L 23/5283* (2013.01); *H01L 28/60* (2013.01)

(56) References Cited

U.S. PATENT DOCUMENTS

| | | | |
|---|---|---|---|
| 2005/0087789 A1* | 4/2005 | Baik | H01L 28/91 438/665 |
| 2006/0079049 A1* | 4/2006 | Kundalgurki | H01L 28/91 438/243 |
| 2007/0170487 A1 | 7/2007 | Heitmann et al. | |
| 2010/0187588 A1* | 7/2010 | Kim | H10B 12/318 257/306 |
| 2015/0221718 A1 | 8/2015 | Rhie | |

OTHER PUBLICATIONS

Written Opinion for International Application PCT/CN2021/103800 mailed Sep. 28, 2021.

\* cited by examiner

SEMICONDUCTOR STRUCTURE AND ITS MANUFACTURING METHOD

CROSS-REFERENCE TO RELATED APPLICATIONS

This application is a continuation of International Patent Application No. PCT/CN2021/103800 filed on Jun. 30, 2021, which claims priority to Chinese Patent Application No. 202010963896.9 filed on Sep. 14, 2020. The above-referenced applications are incorporated herein by reference in their entireties.

TECHNICAL FIELD

The present application relates to the field of semiconductors, and in particular, to a semiconductor structure and its manufacturing method.

BACKGROUND

With the shrinkage of sizes of semiconductor structures, it is increasingly difficult to increase or maintain a capacitance value of a single capacitor structure. When a same dielectric material is used, the capacitance value can be increased only by increasing a surface area of an electrode plate or reducing a thickness of a dielectric layer, but the latter may lead to a high leakage current.

Therefore, changing the capacitor structure to increase the surface area of the electrode plate is a current important development direction of increasing the capacitance value of the capacitor structure.

SUMMARY

An objective of embodiments of the present application is to provide a semiconductor structure and its manufacturing method, which helps increase a capacitance value of a single capacitor structure.

In order to solve the above problem, the embodiments of the present application provide a semiconductor structure, including: a substrate, the substrate being provided with a conductive structure; a first lower electrode and a second lower electrode sequentially stacked, the first lower electrode being located between the second lower electrode and the substrate, the first lower electrode being columnar, the second lower electrode being in a shape of a recess, and the first lower electrode being electrically connected to the conductive structure; a first dielectric layer and a first upper electrode, the first dielectric layer covering a sidewall surface of the first lower electrode, and the first upper electrode being located on one side of the first dielectric layer away from the first lower electrode; and a second dielectric layer and a second upper electrode, the second dielectric layer covering an inner wall and a bottom surface of the second lower electrode, and the second upper electrode filling the recess of the second lower electrode.

Correspondingly, the embodiments of the present application further provide a semiconductor structure manufacturing method, including: providing a substrate, the substrate being provided with a conductive structure; forming a first lower electrode electrically connected to the conductive structure, the first lower electrode being columnar; sequentially forming a first dielectric layer and a first upper electrode on a sidewall surface of the first lower electrode, the first dielectric layer being located between the first lower electrode and the first upper electrode; forming a second lower electrode on one side of the first lower electrode away from the substrate after the first upper electrode is formed, the second lower electrode being in a shape of a recess; and forming a second dielectric layer on an inner wall and a bottom surface of the second lower electrode, and forming a second upper electrode filling the recess of the second lower electrode.

BRIEF DESCRIPTION OF DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DESCRIPTION OF EMBODIMENTS

In order to make objectives, technical solutions and advantages of the embodiments of the present application clearer, various embodiments of the present application will be described below in detail with reference to the drawings. However, those of ordinary skill in the art may understand that, in the embodiments of the present application, numerous technical details are set forth in order to enable a reader to better understand the present application. However, the technical solutions claimed in the present application can be implemented without these technical details and various changes and modifications based on the embodiments below.

FIG. 1 to FIG. 23 are schematic diagrams of cross-sectional structures corresponding to steps of a semiconductor structure manufacturing method according to an embodiment of the present application.

Figure 1:
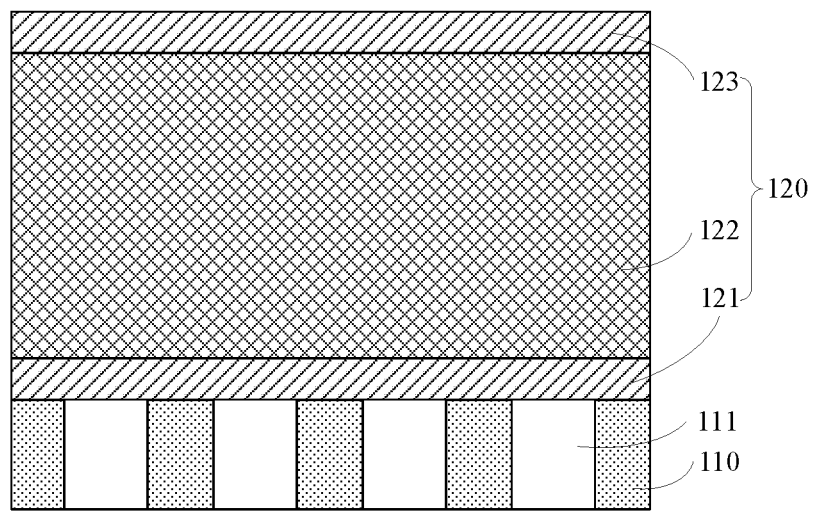
FIG. 1 to FIG. 23 are schematic diagrams of cross-sectional structures corresponding to steps of a semiconductor structure manufacturing method according to an embodiment of the present application.

Referring to FIG. 1, a substrate 110 is provided, and the substrate 110 is provided with a conductive structure 111; a first medium layer 120 is formed on the substrate 110.

The conductive structure 111 may be a separate conductive structure located in the substrate 110 or a conductive contact region of the substrate 110. For example, the substrate 110 is made of polysilicon, and the conductive structure 111 is a doping region of the substrate 110.

In this embodiment, the first medium layer 120 includes a first support layer 121, a first sacrificial layer 122 and a second support layer 123 sequentially stacked in a direction perpendicular to the substrate 110, and hardness of the first support layer 121 and hardness of the second support layer 123 are greater than hardness of the first sacrificial layer 122. The first support layer 121 and the second support layer 123 are configured to support a subsequently-formed first lower electrode, which helps prevent toppling or collapse of the first lower electrode.

The first support layer 121 and the second support layer 123 are made of nitride. The first support layer 121 and the second support layer 123 may be formed by a monolithic or furnace-tube machine reaction using a chemical vapor deposition process or an atomic layer deposition process. The first sacrificial layer 122 is made of an oxide or Borophospho-silicate Glass (BPSG). The first sacrificial layer 122 may be formed by a chemical vapor deposition process.

In this embodiment, the first lower electrode has two support layers, the first support layer 121 is located between bottoms of subsequently-formed first lower electrodes, and the second support layer 123 is located between the subsequently-formed first lower electrodes. In this way, the bottom and the top of the first lower electrode are supported and fixed simultaneously, to further prevent the toppling or collapse of the first lower electrode. At the same time, since the first support layer 121 and the second support layer 123 are located at the top and the bottom of the first medium layer 120 respectively, the first sacrificial layer 122 may exist as a whole rather than being divided into a plurality of spaced film layers. This helps reduce the difficulty of removing the sacrificial layer 122 and the difficulty of uniformly depositing the first dielectric layer through the via on the support layer and ensure good electrical properties of the semiconductor structure.

In other embodiments, only a single support layer is provided between the first lower electrodes. The single support layer may be located between the bottoms of the first lower electrodes or between the tops of the first lower electrodes, or at any position between the first lower electrodes.

In this embodiment, since the first lower electrode is formed in the first medium layer 120, a thickness of the first medium layer 120 in a direction perpendicular to the substrate 110 is equal to a length of a trench subsequently formed and configured to fill the first lower electrode. The thickness of the first medium layer 120 in the direction perpendicular to the surface of the substrate 110 is not specifically limited in this embodiment. The thickness of the first medium layer 120 in the direction perpendicular to the surface of the substrate 110 may range from 1000 nm to 1500 nm, for example, 1100 nm, 1250 nm or 1400 nm.

Figure 2:
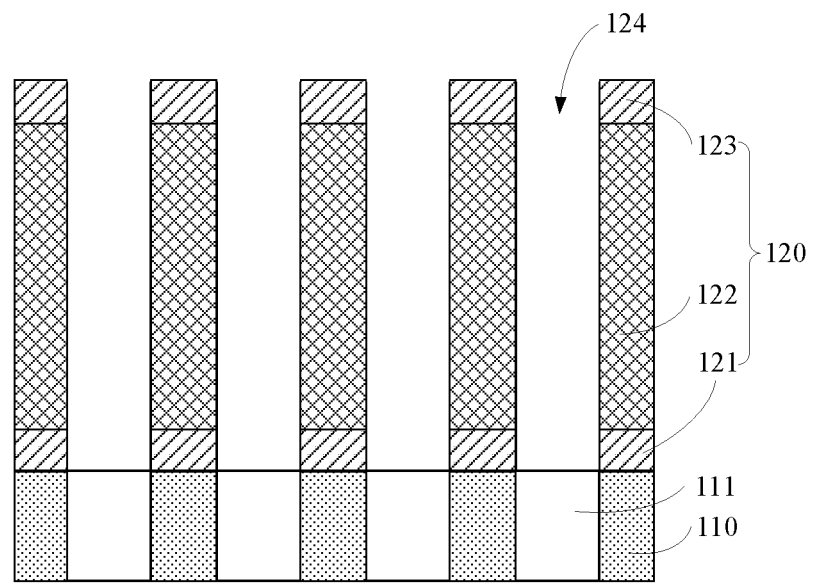

Referring to FIG. 2, the second support layer 123, the first sacrificial layer 122 and the first support layer 121 are sequentially etched to form a first electrode groove 124 exposing the conductive structure 111.

The first electrode groove 124 is configured to be filled with a conductive material to form the first lower electrode.

In this embodiment, a plurality of discrete first electrode grooves 124 are arranged in an array. In other embodiments, only a single first electrode groove is provided or a plurality of discrete first electrode grooves are irregularly arranged.

A mask configured to form the first electrode groove 124 by etching may be manufactured by lithography or by using a dual imaging technology. In addition, an etching agent for etching the first medium layer 120 may be a mixture of gases including $SF_6$, CFx, $Cl_2$ and Ar, in which Ar mainly plays a cleaning role. Besides, an etching process includes a bias etching process which helps improve the position accuracy of the first electrode groove 124, thereby achieving a better signal transmission effect between different conductive structures.

Figure 3:
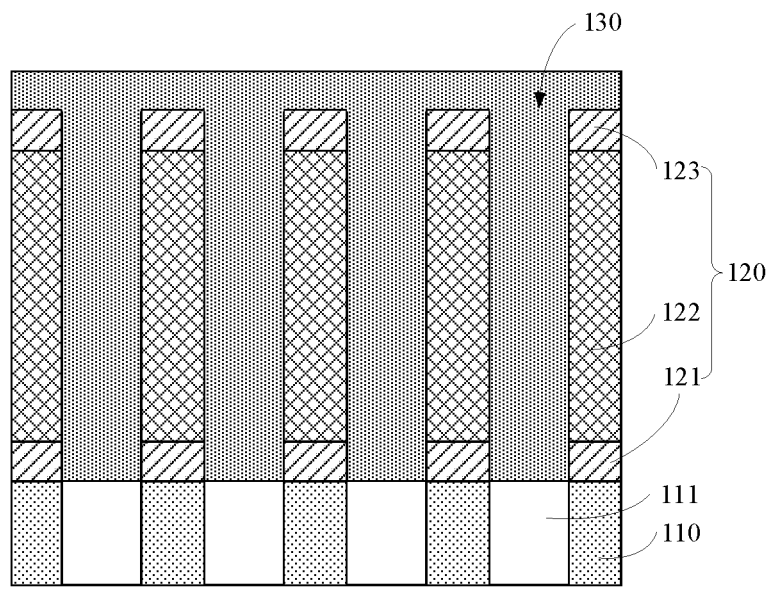
Figure 4:
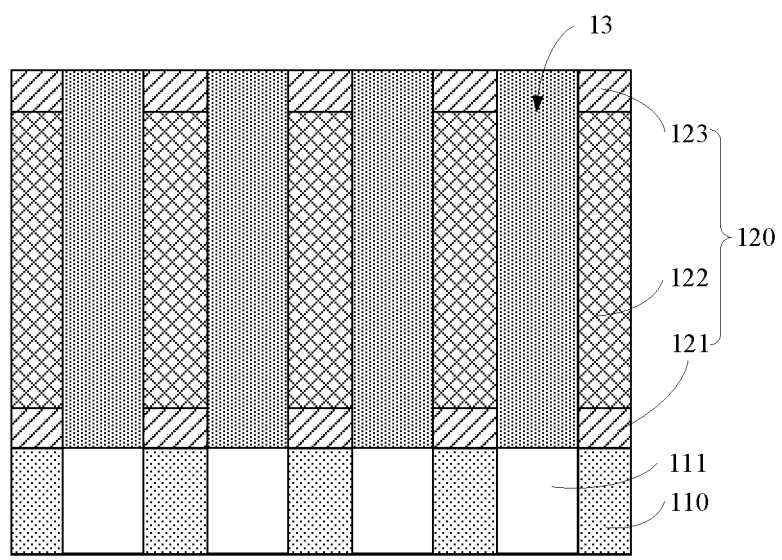

Referring to FIG. 3 and FIG. 4, the first electrode groove 124 (refer to FIG. 2) is filled to form a first lower electrode film 130; and the first lower electrode film 130 is etched back to form a first lower electrode 13.

In this embodiment, the first lower electrode film 130 is formed by a deposition process, and the first lower electrode film 130 fills the first electrode groove 124 and covers a top surface of the second support layer 123; the first lower electrode film 130 covering the top surface of the second support layer 123 is removed by a planarization process or a dry etching process to form a plurality of discrete first lower electrodes 13.

The first lower electrode 13 is made of a conductive material such as titanium, titanium nitride or tungsten. The first lower electrode 13 may be a monolayer structure composed of a single material or a laminated structure composed of a plurality of conductive film layers.

Figure 5:
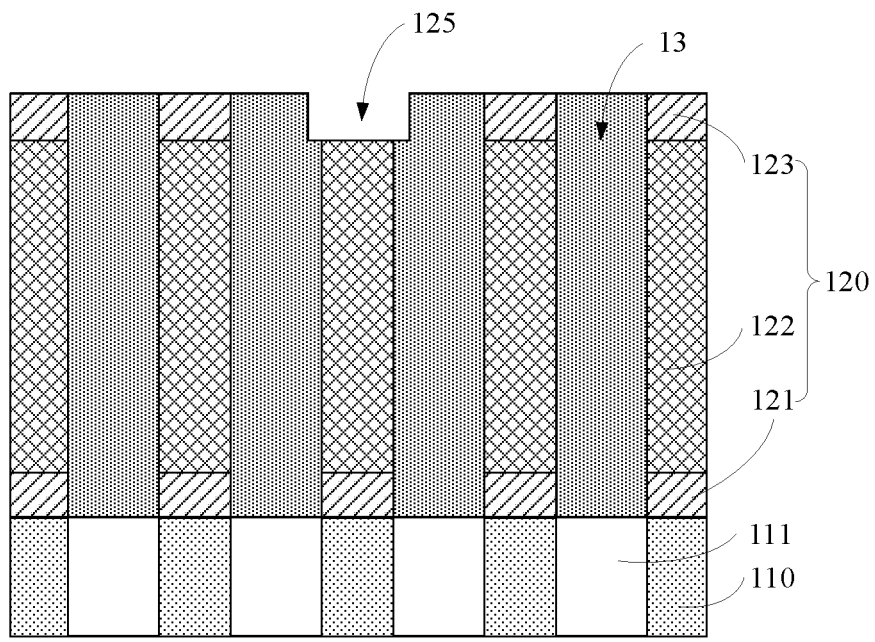
Figure 6:
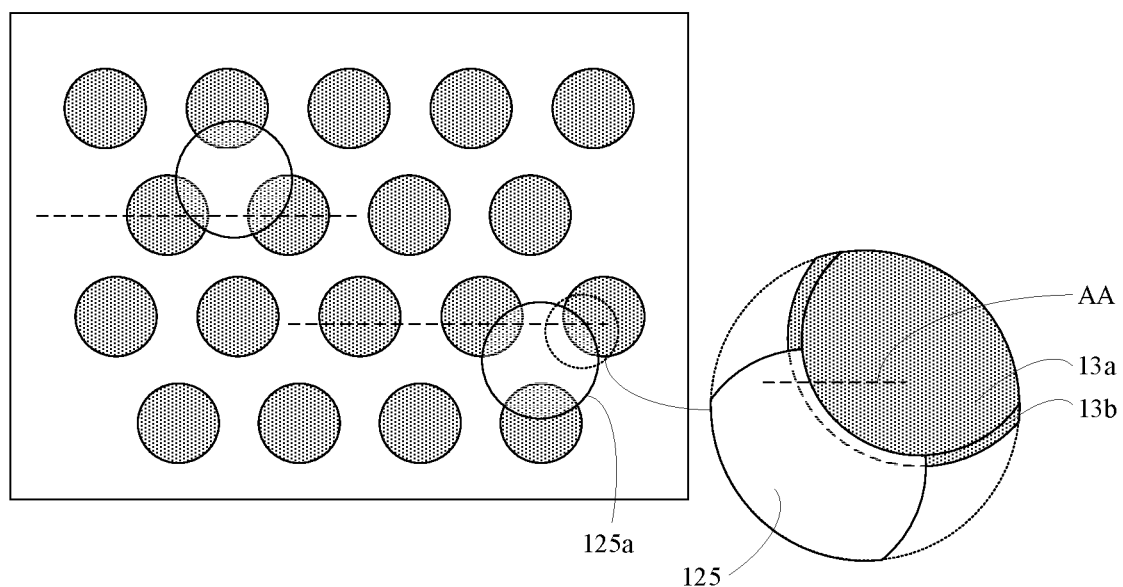

Referring to FIG. 5 and FIG. 6, the second support layer 123 is etched to form a via 125, and the via 125 exposes the first sacrificial layer 122.

In this embodiment, an etching process is performed on the second support layer 123 through a mask having an opening pattern 125a, two opening patterns 125a are provided, and the opening pattern 125a is in a shape of a circle. In other embodiments, one or more than two opening patterns may be provided, and the opening pattern may also be in a shape of a square, a hexagon or the like.

A number and a projection area of the opening pattern 125a may be set according to an orthographic projection area of the first sacrificial layer 122 required to be etched away subsequently in the direction perpendicular to the surface of the substrate 110. The larger the orthographic projection area of the first sacrificial layer 122, the greater the number and/or the projection area of the opening pattern 125a. This helps shorten the process time of subsequently etching away the first sacrificial layer 122 and improve the process efficiency.

In this embodiment, in the direction perpendicular to the surface of the substrate 110, the orthographic projection of each opening pattern 125a not only covers regions among a plurality of first lower electrode 13, but also partially overlaps with the orthographic projection of at least one first lower electrode 13. This helps enlarge a size of a single via 125, and the etching agent can etch the first sacrificial layer 122 at a faster rate through the larger via 125, thereby shortening the time of the etching process.

In addition, three adjacent first lower electrodes 13 are arranged in an equilateral triangle, and an orthographic projection of a center of the opening pattern 125a is equidistant from a central axis of each first lower electrode 13. This helps prevent different effects of the etching of the via 125 on different first lower electrodes 13 and ensure that different first lower electrodes 13 have a same or similar performance, which is conducive to improving the performance stability of the semiconductor structure.

In this embodiment, the first lower electrode 13 includes a first portion 13a located at a central position and a second portion 13b around the first portion 13a and in contact with the second support layer 123. During the etching of the second support layer 123, since an etch selectivity ratio of the second support layer 123 to the first lower electrode 13 by a same etching process cannot be infinite, the etching agent may etch away the second portion 13b contacted. In this way, in a cross-sectional direction AA, a width of the via 125 is greater than that of the second support layer 123 between adjacent first lower electrodes 13.

Figure 7:
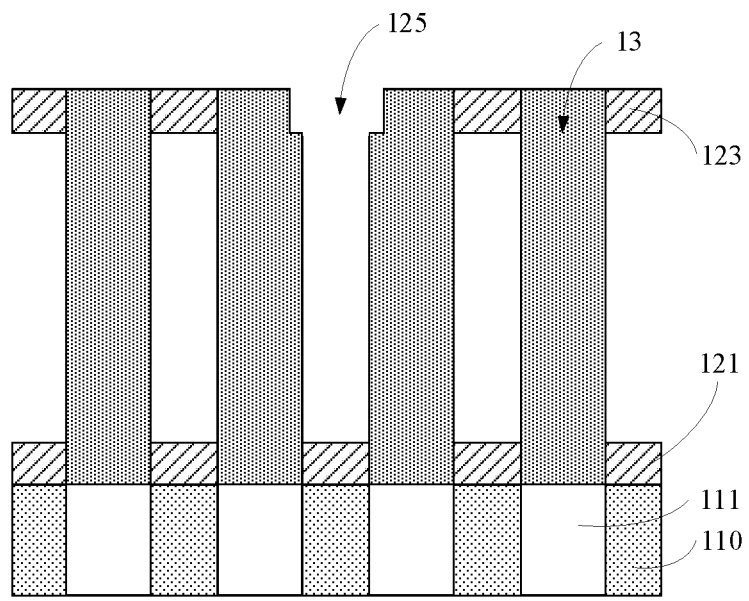

Referring to FIG. 7, a wet etching process is performed through the via 125 to remove the first sacrificial layer 122 (refer to FIG. 6).

Since the first sacrificial layer 122 is etched with an etching solution in the wet etching process, the flowing etching solution may apply compressive stress to the first lower electrode 13 in the process step of removing the etching solution after completion of the etching. The first support layer 121 and the second support layer 123 are provided to help prevent the toppling or collapse of the first lower electrode 13 caused by the compressive stress and to ensure the good structural stability of the first lower electrode 13.

Figure 8:
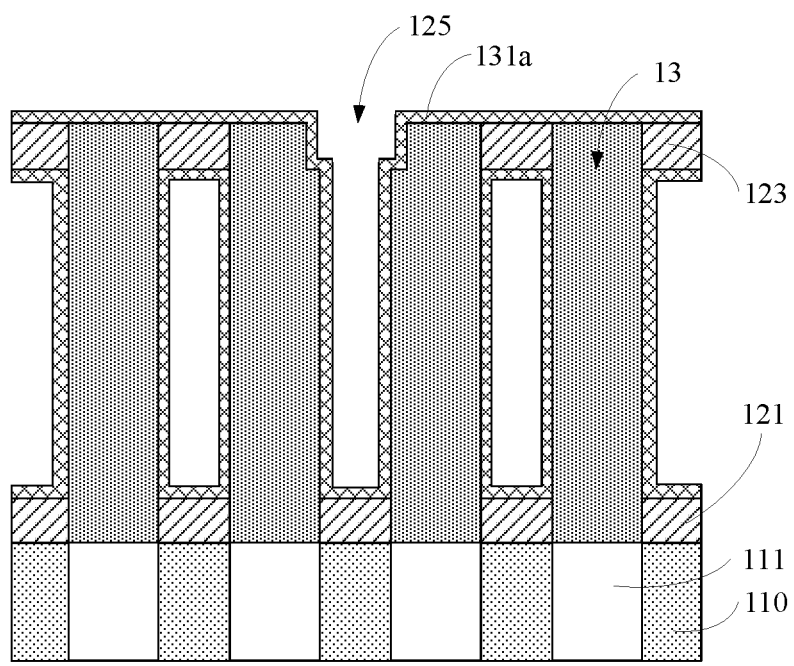

Referring to FIG. 8, a first deposition process is performed through the via 125 to form a first dielectric film 131a.

The first deposition process includes a vapor deposition process or an atomic layer deposition process. A coverage region of the first dielectric film 131a is the same as a contact region of a vapor phase precursor or a carrier gas carrying a precursor. Specifically, the first dielectric film 131a covers a sidewall surface and a top surface of the first lower electrode 13, a top surface of the first support layer 121 and a top surface and a bottom surface of the second support layer 123.

In this embodiment, a material of the first dielectric film 131a has a high dielectric constant. The material of the first dielectric film 131a includes at least one of ZrO, AlO, HfO, SiO, NbO and SiN. The first dielectric film 131a may be a monolayer structure composed of a single material or a laminated structure composed of a plurality of conductive film layers. The laminated structure may be formed by a furnace-tube or monolithic atomic layer deposition process.

Figure 9:
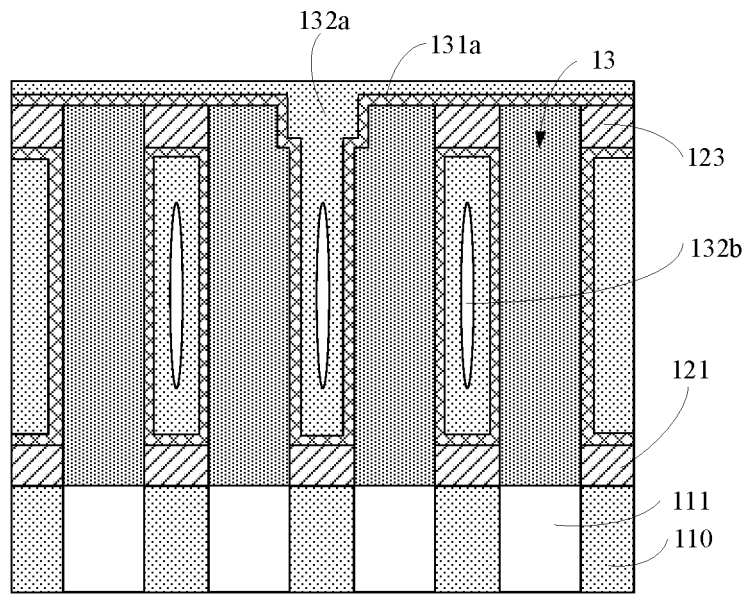

Referring to FIG. 9, a second deposition process is performed through the via 125 (refer to FIG. 8) to form a first upper electrode film 132a on one side of the first dielectric film 131a away from the first lower electrode 13.

The second deposition process includes a vapor deposition process or an atomic layer deposition process. A coverage region of the first upper electrode film 132a is the same as a contact region of a vapor phase precursor or a carrier gas carrying a precursor.

In this embodiment, during the formation of the first upper electrode film 132a, the first upper electrode film 132a is enabled to have a first gap 132b located between adjacent first lower electrodes 13 by controlling a deposition rate of the second deposition process. The setting of the first gap 132b helps reduce a bit error rate caused by a coupling effect of adjacent capacitors.

The process step of forming a first gap 132b may include: first performing the second deposition process at a slow deposition rate so as to form the first upper electrode film 132a on the side of the first dielectric film 131a away from the first lower electrode 13, the first upper electrode film 132a having an undeposited gap; and when a size of the undeposited gap meets a preset requirement, accelerating the deposition rate of the second deposition process to achieve rapid sealing to form the first gap 132b.

Figure 10:
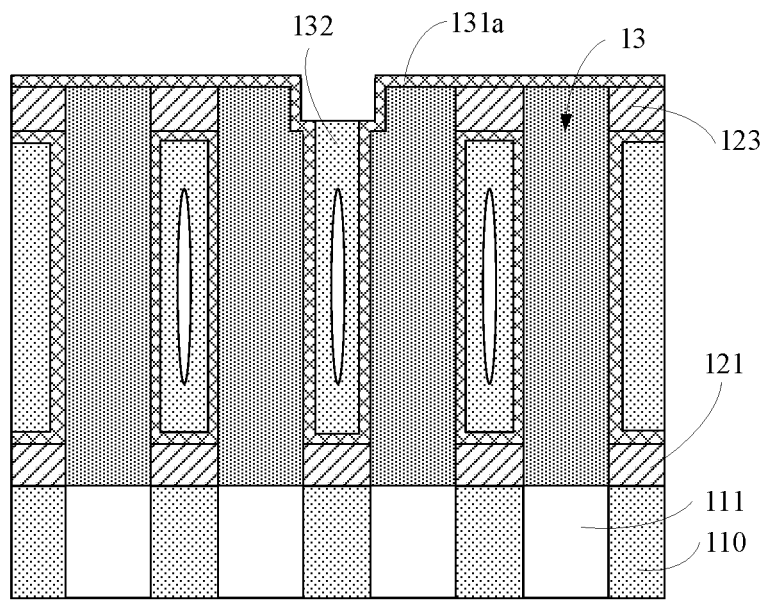
Figure 11:
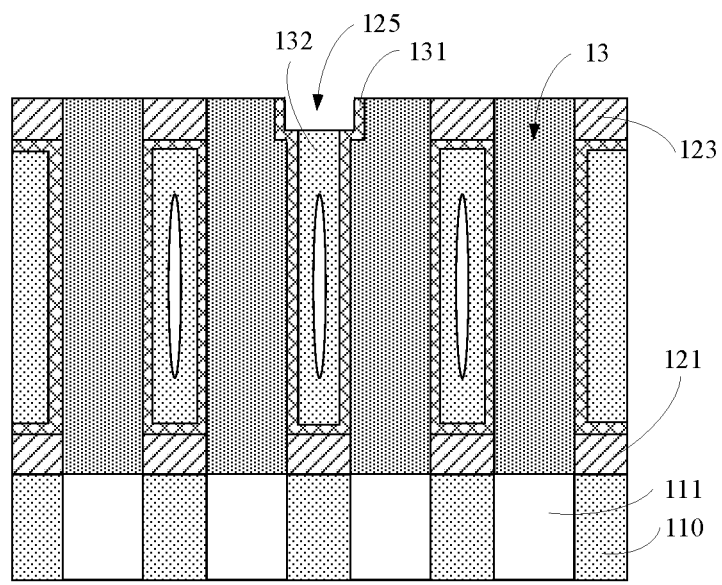

Referring to FIG. 10 and FIG. 11, the first upper electrode film 132a (refer to FIG. 9) and the first dielectric film 131a (refer to FIG. 9) are sequentially etched to form the first upper electrode 132 and the first dielectric layer 131.

The first lower electrode 13, the first dielectric layer 131 and the first upper electrode 132 form a first-type capacitor structure, that is, a columnar capacitor structure.

In this embodiment, part of the first upper electrode film 132a located at the top of the second support layer 123 and part of the first upper electrode film 132a located in the second support layer 123 are sequentially etched, that is, the first upper electrode film 132a in the via 125 is etched away, to form the first upper electrode 132. The purpose of etching away the first upper electrode film 132a in the via 125 is to reserve space to fill an insulating medium, so that the first upper electrode 132 can be electrically isolated from a subsequently-formed second lower electrode, which prevents signal interference between different capacitor structures and ensures good signal stability of the semiconductor structure.

In this embodiment, the purpose of the etching the first dielectric film 131a is to expose a top surface of the first upper electrode 132, so that the first lower electrode 132 can be electrically connected to the subsequently-formed second lower electrode, and to reduce a thickness of the semiconductor structure, so that the semiconductor structure has a smaller package dimension.

In this embodiment, the first dielectric layer 131 covers a sidewall of the via 125. When the first dielectric layer 131 covers the sidewall of the via 125, in a cross-sectional direction AA (not shown), a width of a backfill portion formed by subsequently filling the via 125 is determined by a thickness of the first dielectric layer 131. The width of the backfill portion may be greater than, less than or equal to that of the second support layer 123 between tops of adjacent first lower electrodes 13.

Figure 12:
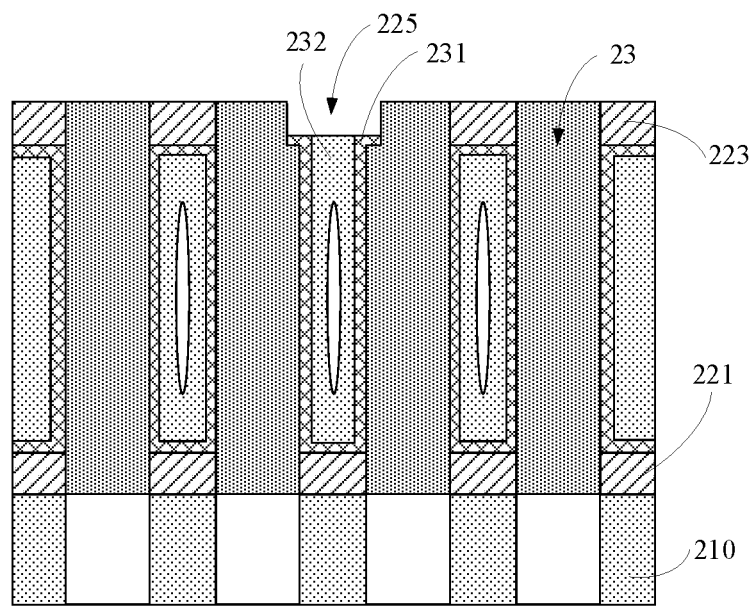

In other embodiments, referring to FIG. 12, a first dielectric layer 231 is located only at a bottom of a via 225.

When the first dielectric layer 231 is located only at the bottom of the via 225, a backfill portion subsequently filling the via 225 is configured to isolate a first upper electrode 232 from a subsequently-formed second lower electrode and isolate adjacent first lower electrodes 23. In addition, in a cross-sectional direction AA (not shown), a width of the via 225 is greater than that of a second support layer 223 located between adjacent first lower electrodes 23. Therefore, a width of the backfill portion subsequently filling the via 225 is greater than that of the second support layer 223 located between the adjacent first lower electrodes 23; that is, the second support layer 223 between the first lower electrodes 23 has a different dimension along a direction of a surface of a substrate 210.

Correspondingly, the second support layer 223 between the first lower electrodes 23 having a larger dimension along the direction of the surface of the substrate 210 is in direct contact with the first upper electrode 232 therebelow; and the second support layer 223 between the tops of the first lower electrodes 23 having a smaller dimension along the direction of the surface of the substrate 210 is in direct contact with the first dielectric layer 231 therebelow.

Figure 13:
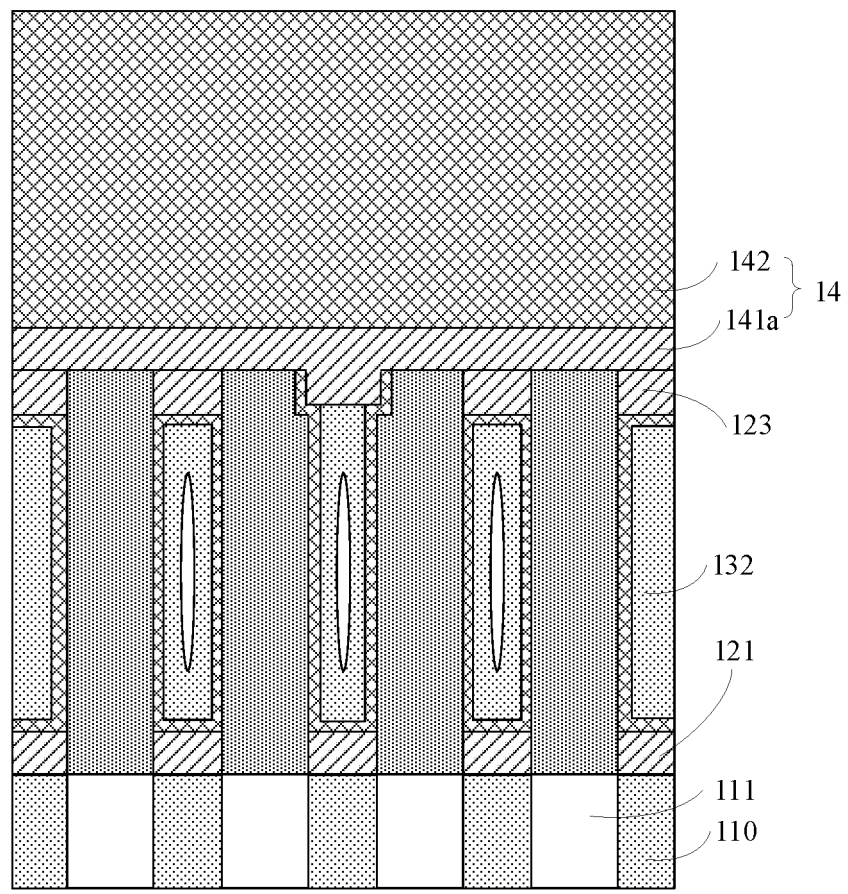

Referring to FIG. 13, a second medium layer 14 is formed on one side of the first lower electrode 13 away from the substrate 110.

In this embodiment, the second medium layer 14 includes a third support film 141a and a second sacrificial layer 142 sequentially stacked. The third support film 141a is configured to form the third support layer to support and fix a subsequently-formed second lower electrode, which helps prevent toppling or collapse of the subsequently-formed second lower electrode.

In this embodiment, during the formation of the third support film 141a by deposition, the via 125 (refer to FIG. 11) is further backfilled to form a backfill portion of the second support layer 123. The backfill portion is configured to isolate the first upper electrode 132 from the subsequently-formed second lower electrode.

Since the second lower electrode is subsequently formed in the second medium layer 14, a thickness of the second medium layer 14 in a direction perpendicular to the substrate 110 determines a height of the subsequently-formed second lower electrode. It is to be noted that a thickness of the first lower electrode 13, a thickness of the second lower electrode and a size relationship between the two are not limited herein.

Figure 14:
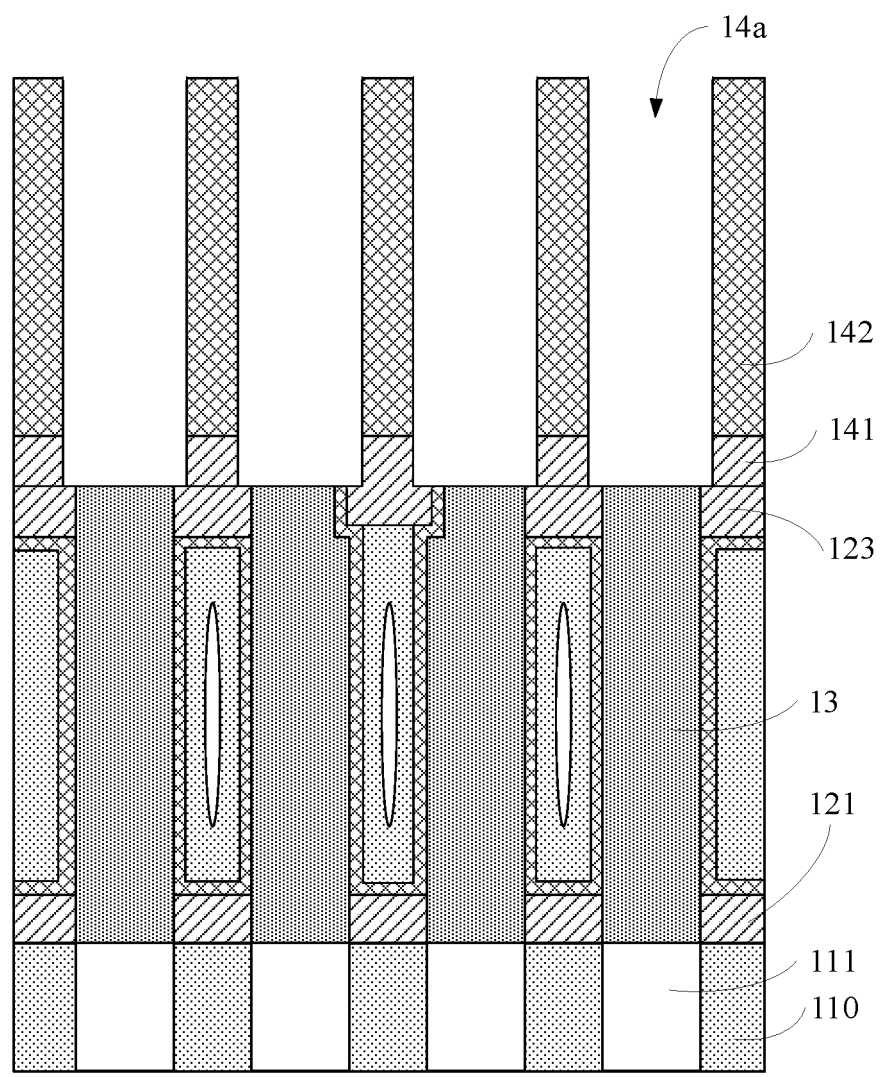

Referring to FIG. 14, the second medium layer 14 (refer to FIG. 13) is etched to form a second electrode groove 14a exposing the top surface of the first lower electrode 13.

In this embodiment, in the direction perpendicular to the surface of the substrate 110, an orthographic projection of the top surface of the first lower electrode 13 is located within an orthographic projection of a bottom surface of the second electrode groove 14a. This helps ensure a larger contact area between the top surface of the first lower electrode 13 and the bottom surface of the subsequently-formed second lower electrode in a case where a formation position of the second lower electrode has a particular position deviation, so as to ensure a good signal transmission effect between the first lower electrode 13 and the second lower electrode.

In this embodiment, during the formation of the second electrode groove 14a, the third support film 141a (refer to FIG. 13) is etched away to form a third support layer 141. The third support layer 141 is located between bottoms of adjacent second electrode grooves 14a. Since a bottom dimension of the second electrode groove 14a is greater than a top dimension of the first lower electrode 13, a dimension of the third support layer 141 between bottoms of adjacent second lower electrodes along the direction of the surface of the substrate 110 is less than that of the second support layer 123 between tops of adjacent first lower electrodes 13 along the direction of the surface of the substrate 110.

In this embodiment, since the backfill portion is formed simultaneously with the formation of the third support film 141a (refer to FIG. 13), the backfill portion and the third support layer 141 are of an integrated structure. In addition, different from the second support layer 123, the third support layer 141 between bottoms of adjacent second electrode grooves 14a has a same dimension along the direction of the surface of the substrate 110.

Figure 15:
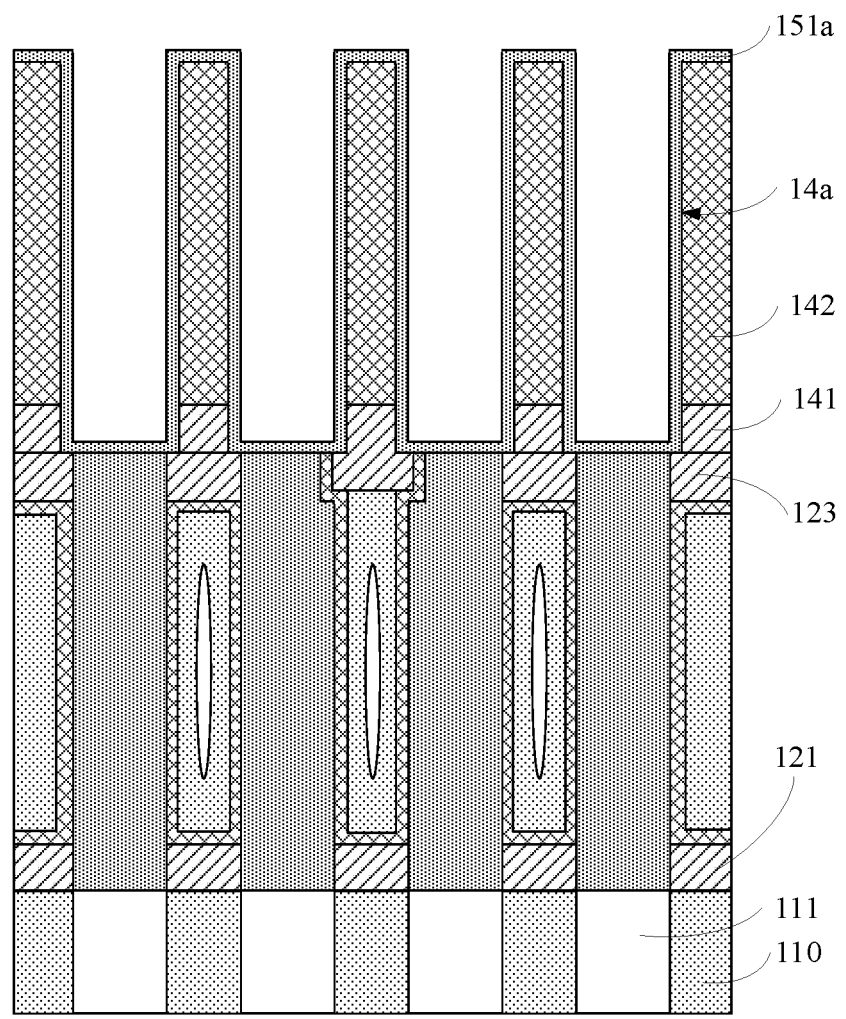
Figure 16:
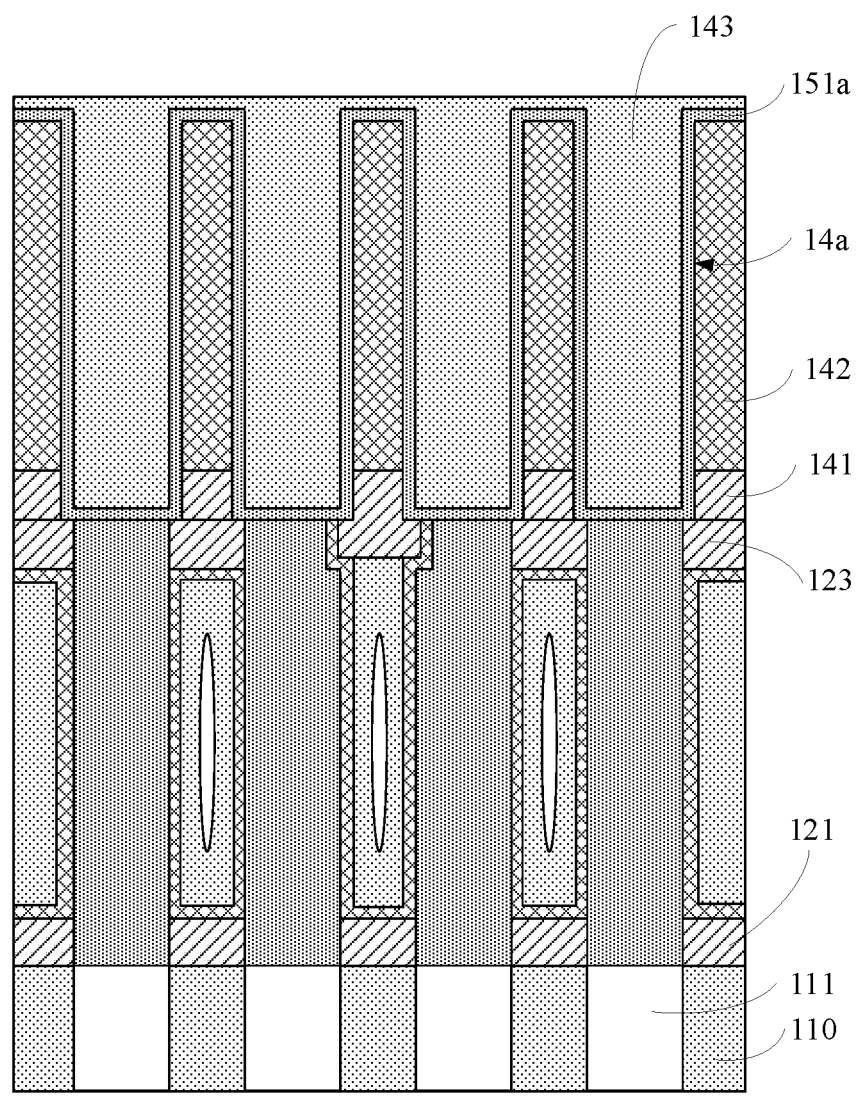

Referring to FIG. 15 and FIG. 16, a third deposition process is performed to form a second lower electrode film 151a covering a sidewall and a bottom surface of the second electrode groove 14a and covering a top surface of the second sacrificial layer 142; and the second electrode groove 14a is filled with a third medium layer 143.

The filling of the third medium layer 143 helps prevent damages to the second lower electrode film 151a located at the bottom and the sidewall of the second electrode groove 14a caused by subsequent process steps, so as to ensure good electrical properties of the second lower electrode film 151a. In addition, the third medium layer 143 further plays a role of supporting a sidewall of a second lower electrode 151 to prevent toppling or collapse of a sidewall of the second lower electrode film 151a after the second sacrificial layer 142 is etched away.

Figure 17:
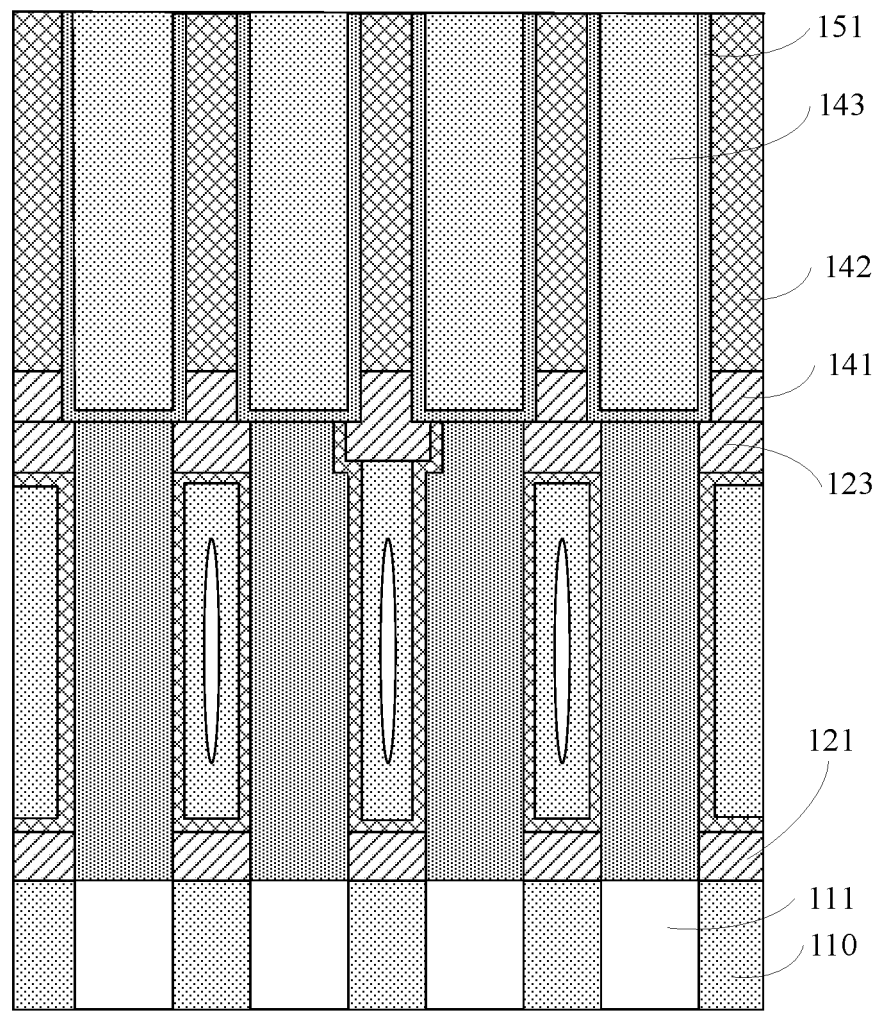

Referring to FIG. 17, a planarization process is performed to remove the second lower electrode film 151a covering the top surface of the second sacrificial layer 142 to form a plurality of discrete second lower electrodes 151.

In this embodiment, a top surface of the third medium layer 143 after the planarization process is flush with a top surface of the second lower electrode 151. In other embodiments, the top surface of the third medium layer after the planarization process is flush with the top surface of the second lower electrode.

Figure 18:
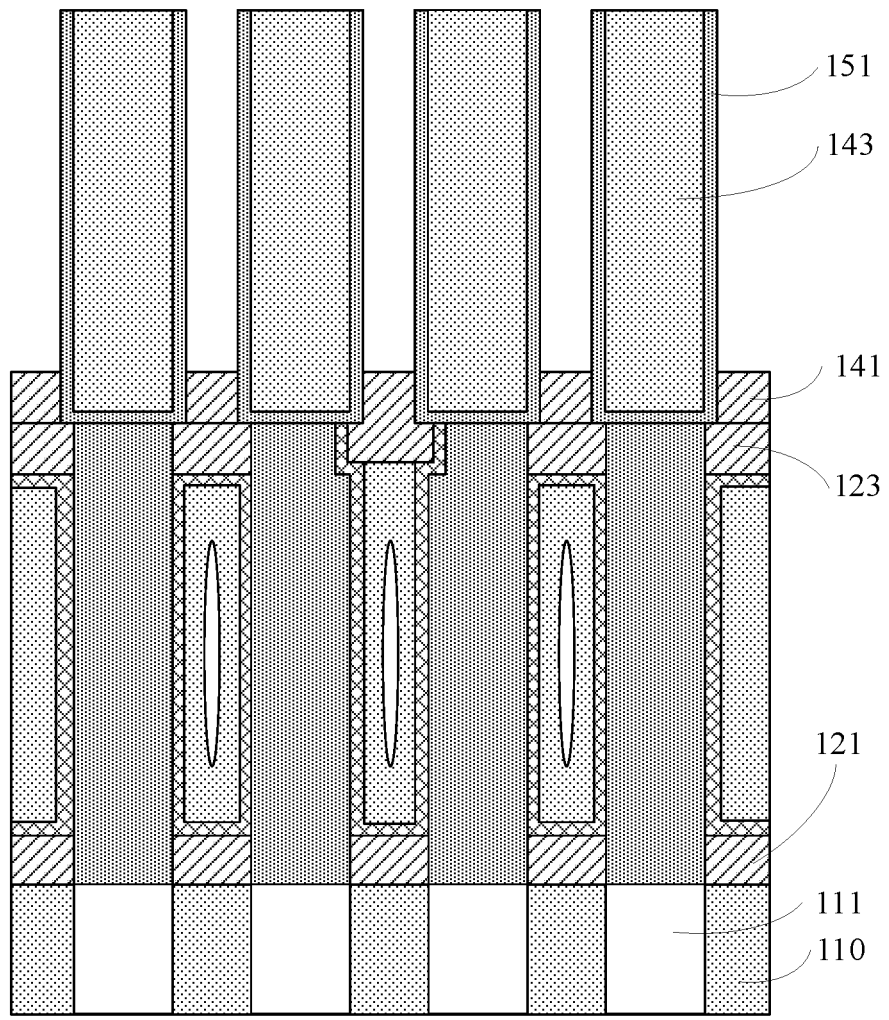

Referring to FIG. 18, the second sacrificial layer 142 (refer to FIG. 17) located between adjacent second lower electrodes 151 is removed.

In this embodiment, the second sacrificial layer 142 is etched to reserve space to form a new isolation layer. A dielectric constant of the isolation layer is less than that of the second sacrificial layer 142. This helps shield signal interference between adjacent second lower electrodes 151 and reduce a bit error rate caused by a coupling effect.

In other embodiments, when the second sacrificial layer has a low dielectric constant, the remaining second sacrificial layer may also be used as the isolation layer to reduce process steps.

Figure 19:
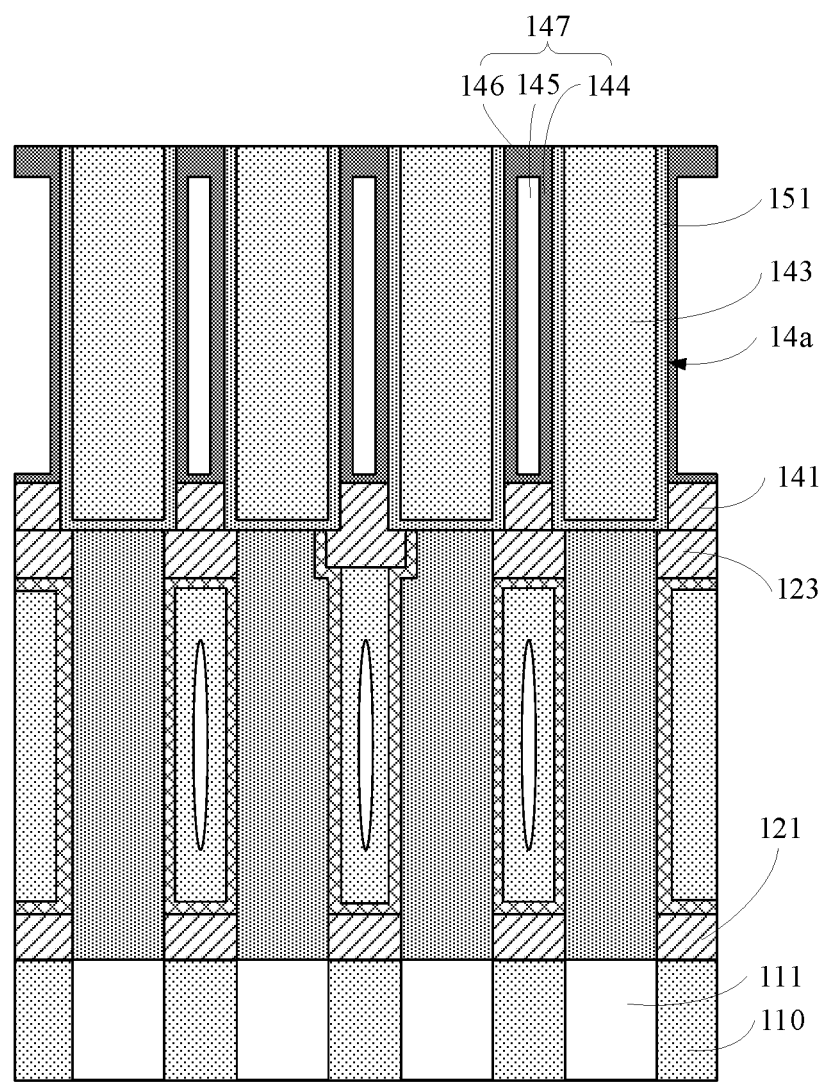

Referring to FIG. 19, an isolation film 144 is formed on an outer wall of the second lower electrode 151, and a second void 145 exists between adjacent isolation films 144. A top of the second void 145 is sealed to form a sealing layer 146. The sealing layer 146, the isolation film 144 and the second void 145 form an isolation layer 147.

In this embodiment, the isolation film 144 covering the outer wall of the second lower electrode 151 and a top surface of the third support layer 141 may be formed by an atomic layer deposition process or a chemical vapor deposition process. The isolation film 144 is configured to isolate adjacent second lower electrodes 151 to prevent electrical contact between adjacent second lower electrodes 151 in case of inclination, so as to ensure high performance stability of the semiconductor structure. The air has a minimum dielectric constant. The setting of the isolation layer 147 including an air gap 145 helps reduce a dielectric constant of the isolation layer 147 and then reduce a bit error rate caused by a coupling effect of the adjacent second lower electrodes 151.

In this embodiment, a material of the isolation layer 147 has a low dielectric constant. The material of the isolation layer 147 includes cobalt silicate, carbon oxide or nitride, etc.

Figure 20:
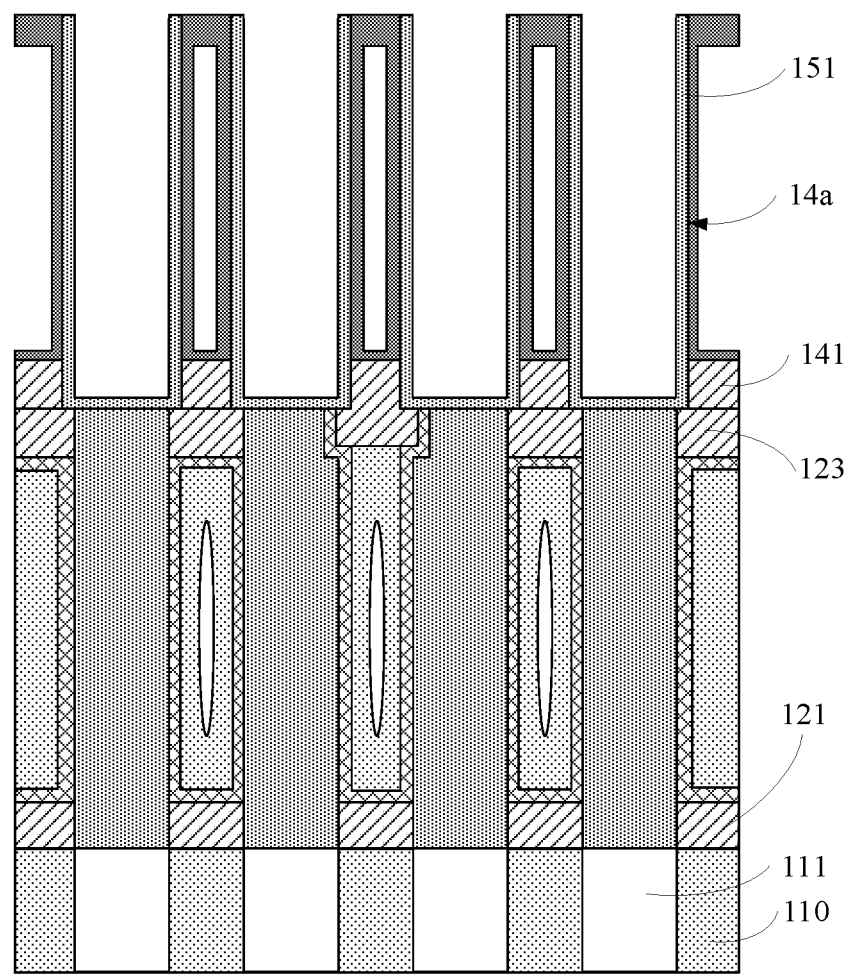

Referring to FIG. 20, the third medium layer 143 (refer to FIG. 19) is removed to expose a bottom surface and an inner wall of the second lower electrode 151.

Figure 21:
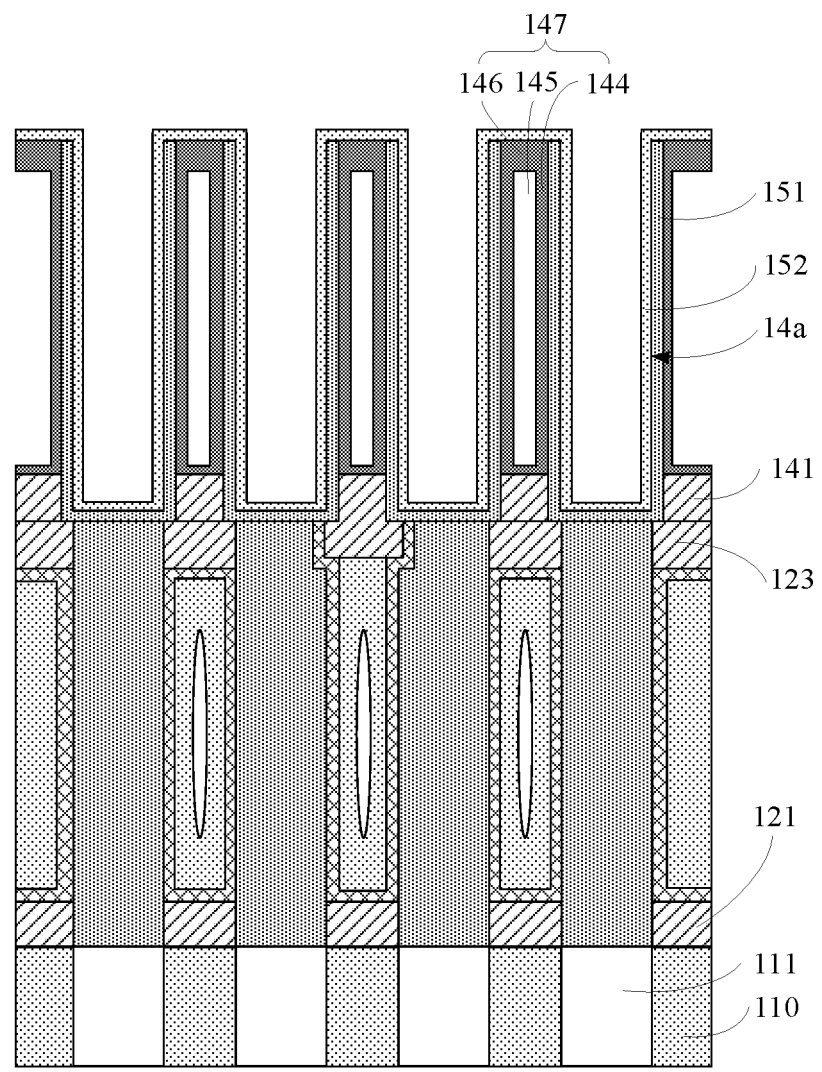

Referring to FIG. 21, a second dielectric layer 152 is formed on the bottom surface and the inner wall of the second lower electrode 151 by using a deposition process. The second dielectric layer 152 is further located on a top surface of the isolation layer 147.

In this embodiment, a material of the second dielectric layer 152 has a high dielectric constant. A material type or structure of the second dielectric layer 152 may be the same or different from that of the first dielectric layer 131.

Figure 22:
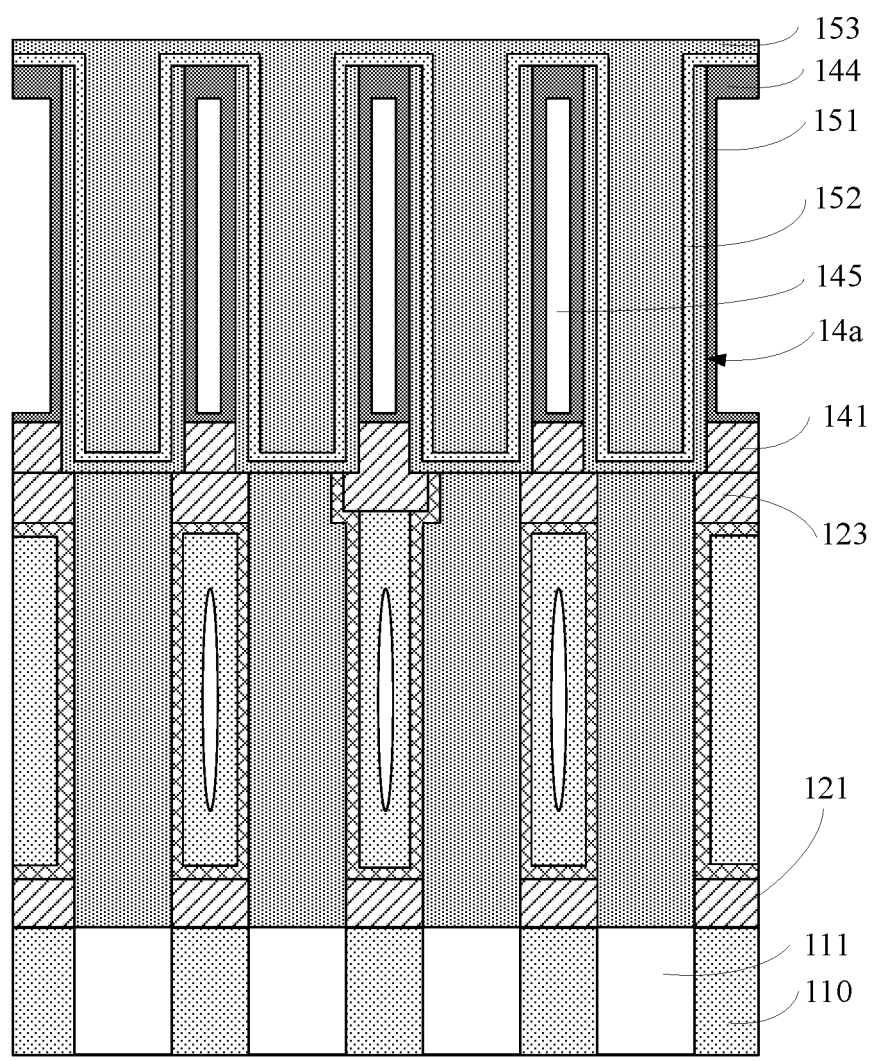

Referring to FIG. 22, the second electrode groove 14a is filled to form the second upper electrode 153.

In this embodiment, the second upper electrode 153 is simultaneously located in recesses of a plurality of second lower electrodes 151; that is, the second upper electrode 153 simultaneously acts as an upper electrode plate of a plurality of capacitors.

The second upper electrode 153, the second dielectric layer 152 and the second lower electrode 151 form a second-type capacitor structure, that is, a concave capacitor structure.

Figure 23:
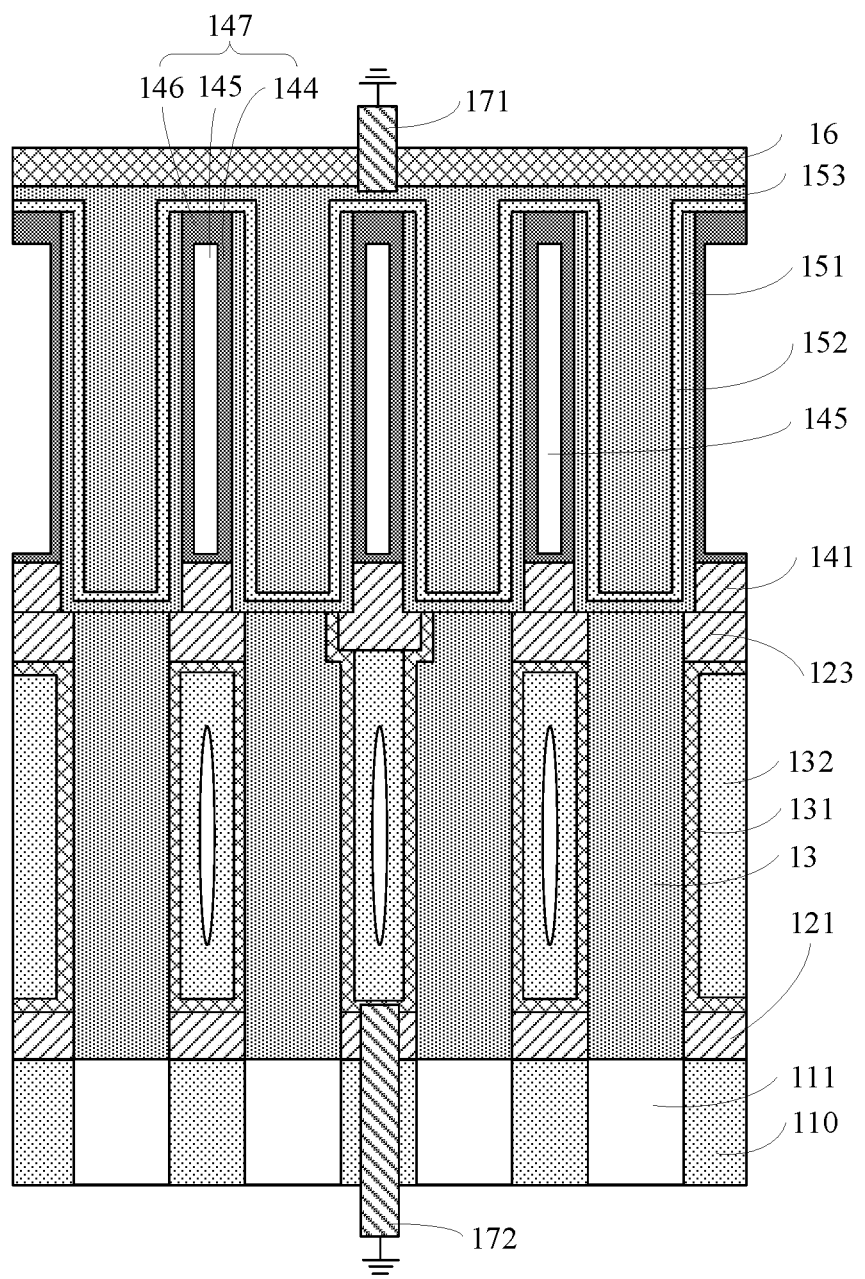

Referring to FIG. 23, an isolation structure 16 is formed to enable the second upper electrode 153 to be connected to a first signal terminal 171 and the first upper electrode 132 to be connected to a second signal terminal 172. The first signal terminal 171 and the second signal terminal 172 may control, by adjusting a voltage signal, capacitance of the first-type capacitor structure and the second-type capacitor structure connected in series, so as to store data information.

In this embodiment, the semiconductor structure includes a first lower electrode and a second lower electrode sequentially stacked, the first lower electrode is configured to form a first-type capacitor structure, the second lower electrode is configured to form a second-type capacitor structure, and the first-type capacitor structure is connected in series with the second-type capacitor structure. In this way, in a case where a capacitance value of the semiconductor structure remains unchanged, there is no need to etch a trench with a large aspect ratio when any type of capacitor structure is formed, which helps ensure that a trench structure of each type of capacitor structure meets preset structural requirements and prevents etching defects. At the same time, since a trench length of each type of capacitor structure can be relatively short, this helps prevent the toppling or collapse of the capacitor structure due to a high aspect ratio during the formation, thereby reducing the process difficulty and ensuring the high structural stability of the semiconductor structure. In addition, since the semiconductor structure is formed by different types of capacitor structures connected in series, the capacitor structure according to the embodiments of the present application can have a greater capacitance value than the capacitor structure of a single type.

Figure 24:
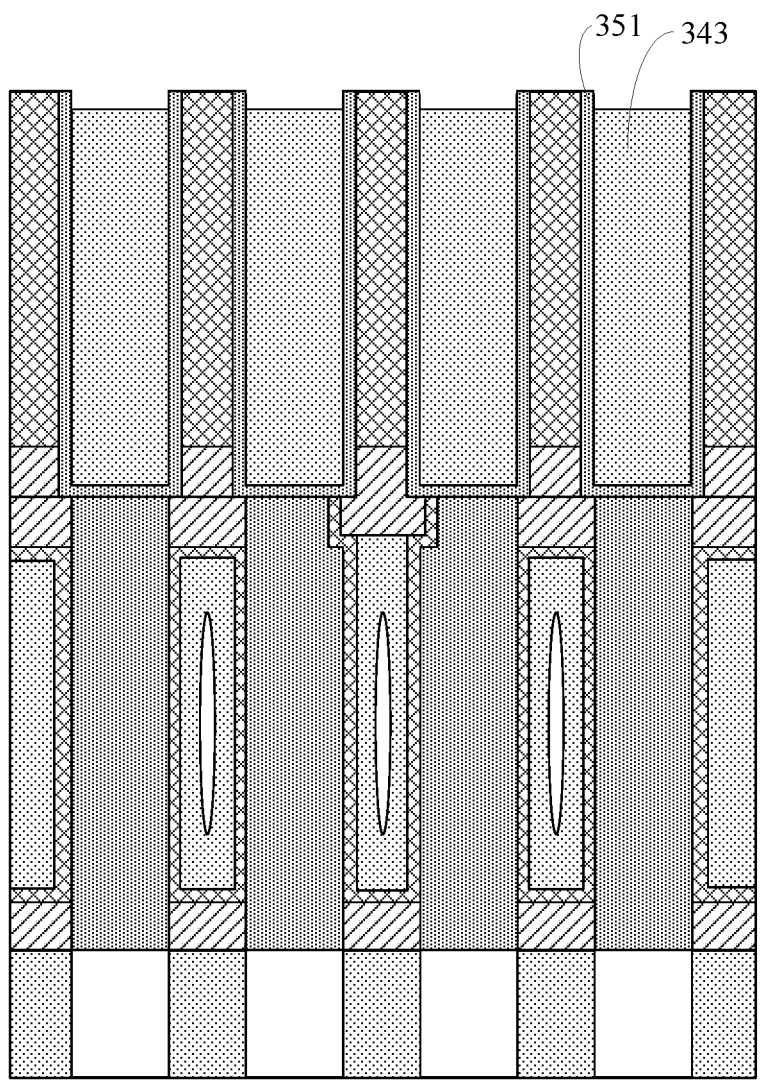
FIG. 24 to FIG. 25 are schematic diagrams of cross-sectional structures corresponding to steps of a semiconductor structure manufacturing method according to another embodiment of the present application.
Figure 25:
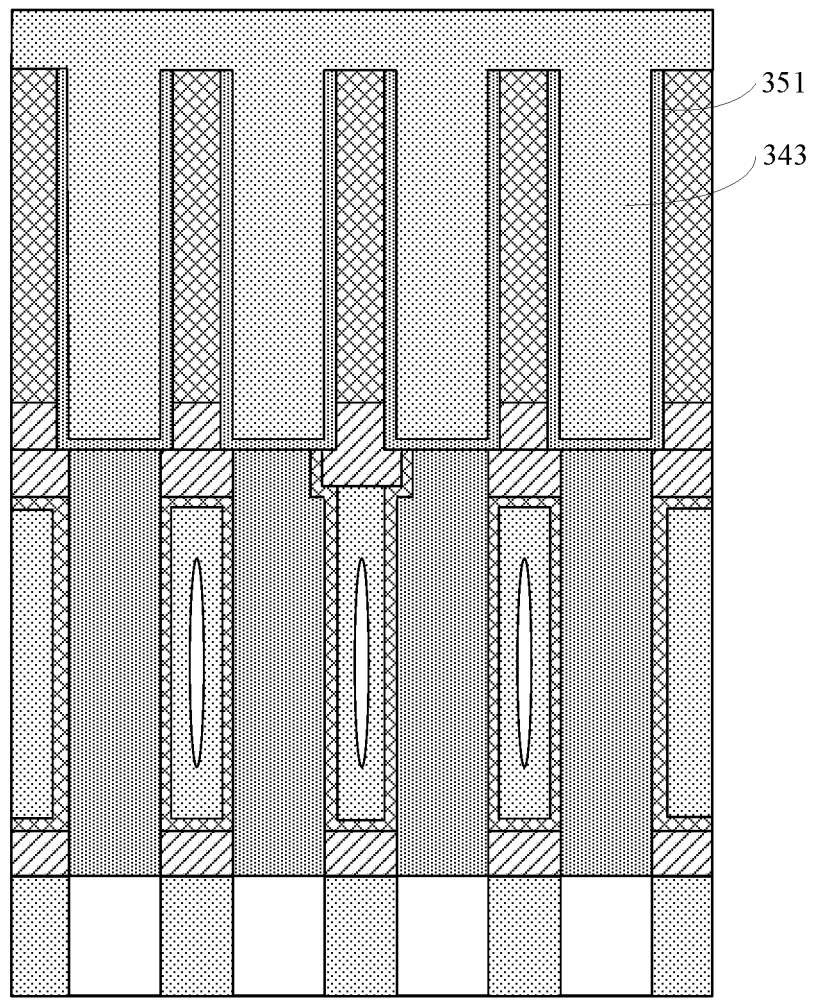

Another embodiment of the present application further provides a semiconductor structure manufacturing method. Different from the previous embodiment, in this embodiment, backfilling is performed after the planarization process. Detailed descriptions are provided below with reference to FIG. 24 to FIG. 25. FIG. 24 to FIG. 25 are schematic diagrams of cross-sectional structures corresponding to steps of a semiconductor structure manufacturing method according to another embodiment of the present application. The parts the same as or corresponding to the previous embodiment can be obtained with reference to the corresponding description in the previous embodiment and are not described in detail below.

Referring to FIG. 24, after the planarization process, a top surface of a third medium layer 343 is lower than that of a second lower electrode 351.

Due to the etch selectivity ratio of the etching agent, an etching rate of the second lower electrode 351 is different from that of the third medium layer 343. At the same time, the third medium layer 343 is generally made of a dielectric material easy to be etched away, and the second lower electrode 351 is generally made of a metal material difficult to be etched away. When the second lower electrode film is etched to form a plurality of discrete second lower electrodes 351, the third medium layer 343 is generally overetched; that is, the top surface of the third medium layer 343 is lower than that of the second lower electrode 351.

In this embodiment, in order to prevent damages caused by a subsequent etching process to an inner wall surface of the second lower electrode 351 exposed by the third medium layer 343, an inner recess of the second lower electrode 351 is required to be backfilled to enable the top surface of the third medium layer 343 to be flush with the top surface of the second lower electrode 351.

It is to be noted that the top surface of the third medium layer 343 being flush with the top surface of the second lower electrode 351 further helps prevent filling of the recess of the second lower electrode 351 with other materials in a subsequent deposition process, so as to prevent the subsequent use of a variety of etching agents to etch different materials to expose an inner wall and a bottom surface of the second lower electrode 351, which helps shorten a process cycle.

Referring to FIG. 25, the recess of the second lower electrode 351 is backfilled.

In this embodiment, after the backfilling, an etch-back process or a planarization process is performed to enable the top surface of the third medium layer 343 to be flush with the top surface of the second lower electrode 351.

In this embodiment, after the planarization process, the recess of the second lower electrode is backfilled and etched back to ensure that the top surface of the third medium layer is flush with the top surface of the second lower electrode, so as to prevent damages to the inner wall of the second lower electrode and reduce subsequent process time of exposing the inner wall and the bottom surface of the second lower electrode.

Correspondingly, an embodiment of the present application further provides a semiconductor structure manufactured with the above semiconductor structure manufacturing method.

Referring to FIG. 23, the semiconductor structure includes: a substrate 110, the substrate 110 being provided with a conductive structure 111; a first lower electrode 13 and a second lower electrode 151 sequentially stacked, the first lower electrode 13 being located between the second lower electrode 151 and the substrate 110, the first lower electrode 13 being columnar, the second lower electrode 151 being in a shape of a recess, and the first lower electrode 13 being electrically connected to the conductive structure 111; a first dielectric layer 131 and a first upper electrode 132, the first dielectric layer 131 covering a sidewall surface of the first lower electrode 13, and the first upper electrode 132 being located on one side of the first dielectric layer 131 away from the first lower electrode 13; and a second dielectric layer 152 and a second upper electrode 153, the second dielectric layer 152 covering an inner wall and a bottom surface of the second lower electrode 151, and the second upper electrode 153 filling the recess of the second lower electrode 151. In this embodiment, in the direction perpendicular to the surface of the substrate 110, an orthographic projection of the top surface of the first lower electrode 13 is located within an orthographic projection of the second lower electrode 151.

In this embodiment, the semiconductor structure further includes: a support layer located between adjacent first lower electrodes 13 and supporting the first lower electrodes 13.

Specifically, the support layer includes a first support layer 121 and a second support layer 123, the first support layer 121 is located between bottoms of the first lower electrodes 13, and the second support layer 123 is located between tops of the first lower electrodes 13.

The support layer further includes a third support layer 141 located between bottoms of the second lower electrodes 151 and configured to support the second lower electrodes 151.

In this embodiment, a dimension of the third support layer 141 between bottoms of adjacent second lower electrodes 151 along a direction of a surface of the substrate 110 is less than that of the second support layer 123 between tops of adjacent first lower electrodes 13 along the direction of the surface of the substrate 110.

In this embodiment, the third support layer 141 between bottoms of adjacent second lower electrodes 151 has a same dimension along the direction of the surface of the substrate 110, and the second support layer 123 between tops of the first lower electrodes 13 has a different dimension along the direction of the surface of the substrate 110. Specifically, the second support layer 123 between the tops of the first lower electrodes 13 having a larger dimension along the direction of the surface of the substrate 110 is in direct contact with the first upper electrode 132 therebelow; and the second support layer 123 between the tops of the first lower electrodes 13 having a smaller dimension along the direction of the surface of the substrate 110 is in direct contact with the first dielectric layer 131 therebelow.

In this embodiment, some second support layers 123 and the third support layer 141 are of an integrated structure.

In this embodiment, the first dielectric layer 131 coats the first upper electrode 132, and the first dielectric layer 131 has a via (not marked) exposing the first upper electrode 132; the support layer has a backfill portion filling the via.

In this embodiment, the first upper electrode 132 is located between adjacent first dielectric layers 131, and the first upper electrode 131 has a first gap (not marked).

In this embodiment, the semiconductor structure further includes an isolation layer 147 located between adjacent second lower electrodes 151 and having a second void 145.

In this embodiment, the semiconductor structure is formed by different types of capacitor structures connected in series. Compared with a single type of capacitor structure, the capacitor structure according to the embodiment of the present application may have a greater capacitance value.

Those of ordinary skill in the art may understand that the above implementations are specific embodiments for implementing the present application. However, in practical applications, various changes in forms and details may be made thereto without departing from the spirit and scope of the present application. Any person skilled in the art can make respective changes and modifications without departing from the spirit and scope of the present application. Therefore, the protection scope of the present application should be subject to the scope defined by the claims.

What is claimed is:

1. A semiconductor structure, comprising:
a substrate, the substrate being provided with a conductive structure;
a first lower electrode and a second lower electrode sequentially stacked, the first lower electrode being located between the second lower electrode and the substrate, the first lower electrode being columnar, the second lower electrode being in a shape of a recess, and the first lower electrode being electrically connected to the conductive structure;
a first dielectric layer and a first upper electrode, the first dielectric layer covering a sidewall surface of the first lower electrode, and the first upper electrode being located on one side of the first dielectric layer away from the first lower electrode;
a second dielectric layer and a second upper electrode, the second dielectric layer covering an inner wall and a bottom surface of the second lower electrode, and the second upper electrode filling the recess of the second lower electrode; and
a support layer comprising a first support layer, a second support layer, the first support layer being located between bottoms of the first lower electrodes, the second support layer being located between tops of the first lower electrodes, and the second support layer between tops of the first lower electrodes having a different dimension along the direction of the surface of the substrate, wherein the second support layer between the tops of the first lower electrodes having a larger dimension along the direction of the surface of the substrate is in direct contact with the first upper electrode therebelow; and the second support layer between the tops of the first lower electrodes having a smaller dimension along the direction of the surface of the substrate is in direct contact with the first dielectric layer therebelow.

2. The semiconductor structure according to claim 1, wherein in a direction perpendicular to a surface of the substrate, an orthographic projection of a top surface of the first lower electrode is located within an orthographic projection of the bottom surface of the second lower electrode.

3. The semiconductor structure according to claim 1, wherein the support layer further comprises a third support layer, the third support layer is located between bottoms of the second lower electrodes, and the third support layer is configured to support the second lower electrodes.

4. The semiconductor structure according to claim 3, wherein a dimension of the third support layer between bottoms of adjacent second lower electrodes along a direction of a surface of the substrate is less than that of the second support layer between tops of adjacent first lower electrodes along the direction of the surface of the substrate.

5. The semiconductor structure according to claim 3, wherein the third support layer between bottoms of adjacent second lower electrodes has a same dimension along the direction of the surface of the substrate.

6. The semiconductor structure according to claim 3, wherein some of the second support layers and the third support layer are of an integrated structure.

7. The semiconductor structure according to claim 1, wherein the first dielectric layer coats the first upper electrode, and the first dielectric layer has a via exposing the first upper electrode; the support layer has a backfill portion, and the backfill portion fills the via.

8. The semiconductor structure according to claim 1, wherein the first upper electrode is located between adjacent first dielectric layers, and the first upper electrode has a first void.

9. The semiconductor structure according to claim 1, further comprising: an isolation layer, the isolation layer being located between adjacent second lower electrodes, and the isolation layer having a second void.

10. A semiconductor structure manufacturing method, comprising:
providing a substrate, the substrate being provided with a conductive structure;
forming a first lower electrode electrically connected to the conductive structure, the first lower electrode being columnar;
sequentially forming a first dielectric layer and a first upper electrode on a sidewall surface of the first lower electrode, the first dielectric layer being located between the first lower electrode and the first upper electrode;
forming a second lower electrode on one side of the first lower electrode away from the substrate after the first upper electrode is formed, die second lower electrode being in a shape of a recess; and
forming a second dielectric layer on an inner wall and a bottom surface of the second lower electrode, and forming a second upper electrode filling the recess of the second lower electrode;
wherein the step of forming a first lower electrode comprises:
forming a first medium layer on the substrate, the first medium layer comprising a first support layer, a first sacrificial layer and a second support layer sequentially stacked in a direction perpendicular to the substrate; and
sequentially etching the second support layer, the first sacrificial layer and the first support layer to form a first electrode groove exposing the conductive structure; and filling the first electrode groove to form the first lower electrode.

11. The semiconductor structure manufacturing method according to claim 10, wherein the process step of forming a first dielectric layer and a first upper electrode comprises:
   etching the second support layer to form a via; and
   performing a wet etching process through the via to remove the first sacrificial layer; performing a first deposition process through the via to form the first dielectric layer on the sidewall surface of the first lower electrode; and performing a second deposition process through the via to form the first upper electrode on one side of the first dielectric layer away from the first lower electrode.

12. The semiconductor structure manufacturing method according to claim 11, wherein after the first upper electrode is formed, the via is backfilled to form a backfill portion.

13. The semiconductor structure manufacturing method according to claim 10, wherein the process step of forming a second lower electrode comprises:
   forming a second medium layer on one side of the first lower electrode away from the substrate;
   etching the second medium layer to form a second electrode groove exposing the first lower electrode, in a direction perpendicular to a surface of the substrate, an orthographic projection of a top surface of the first lower electrode being located within an orthographic projection of the bottom surface of the second electrode groove; and
   performing a third deposition process to form the second lower electrode covering a sidewall and a bottom surface of the second electrode groove.

14. The semiconductor structure manufacturing method according to claim 13, wherein the second medium layer comprises a third support layer and a second sacrificial layer sequentially stacked; and the step of etching the second medium layer comprises:
   sequentially etching the second sacrificial layer and the third support layer.

15. The semiconductor structure manufacturing method according to claim 13, wherein after the second lower electrode is formed, a second sacrificial layer located between adjacent second lower electrodes is removed; an isolation film is formed on an outer wall of the second lower electrode, and a second void exists between adjacent isolation films; a top of the second void is sealed to form a sealing layer, and the sealing layer, the isolation film and the second void form an isolation layer.

16. The semiconductor structure manufacturing method according to claim 15, after the step of forming a second lower electrode and prior to the step of removing a second sacrificial layer located between adjacent second lower electrodes, further comprising:
   filling the second electrode groove forming the second lower electrode with a third medium.

* * * * *